United States Patent [19]

Yoshida et al.

[11] Patent Number: 4,959,296
[45] Date of Patent: Sep. 25, 1990

[54] PROCESS FOR THE DEVELOPMENT OF DRY PS PLATES

[75] Inventors: Susumu Yoshida; Tatsuji Higashi; Hiroshi Takahashi, all of Shizuoka, Japan

[73] Assignee: Fuji Photo Film Co., Ltd., Minami-Ashigara, Japan

[21] Appl. No.: 284,400

[22] Filed: Dec. 14, 1988

[30] Foreign Application Priority Data

Dec. 16, 1987 [JP] Japan ................... 62-317843

[51] Int. Cl.$^5$ .............................. G03F 7/02
[52] U.S. Cl. ...................... 430/302; 430/270; 430/281; 430/294; 430/300; 430/309; 430/331; 430/269
[58] Field of Search ............... 430/309, 331, 269, 300, 430/281, 270, 302, 294

[56] References Cited

U.S. PATENT DOCUMENTS 4,576,743  3/1986  Kita et al. ................. 430/331

FOREIGN PATENT DOCUMENTS 61-275759  5/1986  Japan .

Primary Examiner—Paul R. Michl
Assistant Examiner—Thorl Chea
Attorney, Agent, or Firm—Burns, Doane, Swecker & Mathis

[57] ABSTRACT

A developer for PS plates requiring no dampening water which comprise a substrate provided thereon with a primer layer, photopolymerizable light-sensitive layer and a silicone rubber layer in this order, comprises: (i) an organic solvent which can dissolve or swell non-exposed portions of the photopolymerizable light-sensitive layer and whose solubility in water at ordinary temperature is not more than 20% by weight; (ii) a surfactant; and (iii) water. The developer is excellent in developing properties and dot reproduction, shows high stability and does not cause scratches on the silicone rubber layer during development.

19 Claims, No Drawings

PROCESS FOR THE DEVELOPMENT OF DRY PS PLATES

BACKGROUND OF THE INVENTION

The present invention relates to a developer for presensitized plates (hereunder referred to as "dry PS plate") for use in making a lithographic printing plate which requires no dampening water during printing (hereunder referred to as "dry lithographic printing plate") wherein silicone rubber layer serves as an ink-repellent layer and more specifically to a developer for dry PS plates, which is excellent in safety, developing properties and dot reproduction.

There have been proposed a variety of dry PS plates having a silicone rubber layer serving as an ink repellent layer. Among these, those disclosed in Japanese Patent Publication for Opposition Purpose (hereinafter referred to as "J.P. KOKOKU") Nos. 54-26923; 55-22781 and 56-23150 comprise a substrate provided thereon with a photosetting light-sensitive layer and a silicone rubber layer in order and the lithographic printing plate obtained therefrom makes it possible to obtain several tens of thousands of printed matters without using dampening water.

The aforesaid dry PS plate is in general processed through exposing and developing processes detailed below to form a lithographic printing plate.

First, a dry PS plate is exposed to actinic rays through an original film which is closely placed in contact with the plate in vacuo. Then, the exposed PS plate is immersed in a paraffinic hydrocarbon or a developer mainly comprised of the same. As a result, the silicone rubber layer in non-exposed areas greatly gets swollen with the developer and thus only the silicone rubber layer in the non-exposed areas is removed with or without the dissolution of the light-sensitive layer of the non-exposed areas. These portions from which the silicone rubber layer is removed serve as image areas. On the other hand, the silicone rubber layer in the exposed areas slightly get swollen with the developer, but they are not removed even when strongly rubbed with a pad containing the developer and remain on the plate surface since it is strongly adhered to the light-sensitive layer. Such portions serve as ink-repellent non-image areas. Thus, a dry lithographic printing plate is produced.

In general, components for swelling the silicone rubber layer (hereunder referred to as "silicone rubber swelling agent") and components for dissolving or swelling the light-sensitive layer beneath the silicone rubber layer (hereunder referred to as "developing agent") are possibly used as essential components of a developer for developing such a dry PS plate provided with a silicone rubber layer as an ink-repellent layer. Examples of the silicone rubber swelling agents include a single solvent system such as paraffinic hydrocarbons e.g., pentane, hexane, heptane, octane, nonane and decane; a mixture of isomers thereof or the like; fractional distillates of petroleum corresponding to mixture thereof, for instance, Isopar G and Isopar H (available from ESSO Petroleum Co., Ltd.). In addition, examples of effective developing agents are alcohols, esters, ketones, ethers, aromatic hydrocarbons, halogenated hydrocarbons and carboxylic acids.

A conventional developer for dry PS plates provided with a silicone rubber layer as the upper layer comprises a silicone rubber swelling agent as a basic component and a developing agent. Therefore, it contains the silicone rubber swelling agent in an amount greater than that required for swelling the silicone rubber layer and for this reason, the silicone rubber layer in the non-image areas likely causes scratches during development. In addition, since this silicone rubber swelling agent is composed of a paraffinic hydrocarbon, there is a risk of causing fire for any possible reason. In particular, when an automatic developing machine is used, it is required to use an automatic developing machine provided with a means for preventing firing. However, the use of such an automatic developing machine is not economical since it is very expensive compared with that for pre-sensitized plates (conventional PS plates) which can be processed with a usual water-based developer.

To solve the foregoing problems, Japanese Patent Unexamined Publication (hereinafter referred to as "J.P. KOKAI") No. 61-275759 (which corresponds to U.S. Ser. No. 807,469 filed on Dec. 10, 1985 and now abandoned and DE No. 3,543,961A) proposes a developer for dry PS plates which comprises an organic solvent capable of swelling a silicone rubber layer, a surfactant and not less than 30% by weight of water. This developer does not cause scratches on the silicone rubber layer in non-image areas during development because of the presence of a desired amount of water. Moreover, its ignition point is higher than those of conventional developers free from water or developers having a low water content and it also exhibits high safety. Therefore, the automatic developing machine is not provided with a means for preventing firing and is less expensive.

However, in such a developer for dry plates exhibiting satisfactory properties, the silicone rubber swelling agent, the developing agent for dissolving or swelling the light-sensitive layer and water must be admixed with one another sufficiently. For this reason, not only it is necessary to use a large amount of surfactants but also the temperature and concentration at which the homogeneous mixed system is stable are limited to very narrow range. In addition, since such a developer simultaneously contains a silicone rubber swelling agent and a developing agent for dissolving or swelling the light-sensitive layer, both properties of these agents become insufficient and the developing ability thereof is also low. Further, a large amount of organic solvent must be used and, therefore, the use of such a developer is not preferable from the viewpoint of environmental pollution and health of operators.

Moreover, conventional light-sensitive layers contain a photodimerizable light-sensitive layer (see, for instance, J.P. KOKOKU No. 55-22781). This makes it difficult to dissolve out non-exposed portions of the light-sensitive layer.

Alternatively, to solve the aforesaid problems, Japanese Patent Application Serial (hereinafter referred to as "J.P.A.") No. 62-92374 proposes a dry PS plate which comprises water-soluble light-sensitive composition and thus can be developed with tap water.

The dry PS plate having a silicone rubber layer as an upper layer wherein a water-soluble light-sensitive composition is used shows extremely high stability since it can be developed with tap water. However, the speed of developing the same is very low since it is developed with a simple tap water.

SUMMARY OF THE INVENTION

Accordingly, an object of the present invention is to provide a developer for dry PS plates, which is excellent in developing properties and dot reproduction.

Another object of the present invention is to provide a developer for dry PS plates which is highly stable.

A further object of the present invention is to provide a developer for dry PS plates which does not cause scratches on the silicone rubber layer during development.

A still another object of the present invention is to provide a developer for dry PS plates which can eliminate the necessity of providing a means for preventing firing of an automatic developing machine during development.

The inventors of this invention have conducted various studies, have founds that the aforementioned drawbacks can be solved if a solution comprising an organic solvent which can dissolve or swell non-exposed areas of a light-sensitive layer and whose solubility in water is not less than 20% by weight at ordinary temperature (20° C.) as an organic solvent included in a developer, a surfactant and water is used as a developer for dry PS plates comprised of photopolymerizable light-sensitive layer and thus have completed the present invention. Consequently, the present invention relates to a developer for dry PS plates comprising a substrate provided thereon with a primer layer, a photopolymerizable light-sensitive layer and a silicone rubber layer in this order, which comprises:

(i) an organic solvent which can dissolve or swell non-exposed portions of the photopolymerizable light-sensitive layer and whose solubility in water at ordinary temperature is not more than 20% by weight;

(ii) a surfactant; and (iii) water.

DETAILED EXPLANATION OF THE INVENTION

The mechanism cannot be given clearly about why the developing properties can be improved when a developer comprising a developing agent which is an organic solvent capable of dissolving or swelling non-exposed portions of a photopolymerizable light-sensitive layer and whose solubility in water is not more than 20% by weight, a surfactant and water but not containing any swelling agent for silicone rubber layer is used. However, the following reasons would be possible:

The light-sensitive layer used herein comprises a photopolymerizable light-sensitive layer composed of monomers and/or oligomers. For this reason, the non-exposed portions of the photopolymerizable light-sensitive layer are very rapidly dissolved in or get swollen with a developer and this results in excellent developing properties. Thus, it is thought that such a light-sensitive layer would be developed sufficiently without using a developer free from an organic solvent capable of swelling silicone rubber layer, unlike the case disclosed in J.P. KOKAI No. 61-275759 in which photodimerizable light-sensitive layer is used.

Moreover, it is considered that if the photopolymerizable light-sensitive layer comprises a water-soluble light-sensitive composition, the non-exposed portions thereof are more easily dissolved in a developer and the developing properties thereof are enhanced.

The present invention will hereuder be explained in more detail.

(Substrate)

As a substrate for dry PS plates developed with the developer of the invention, dimensionally stable plate-like substances are used. Such a dimensionally stable plate-like substance may be any substances conventionally used as substrate for printing plates and any of these may preferably be used. Specific examples thereof include paper, paper laminated with a plastic film such as polyethylene, polypropylene or polystyrene film, a metal plate such as an aluminum (inclusive of aluminum alloys), zinc or copper plate, a plastic film such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate or polyvinyl acetal film, and paper or a plastic film laminated with aforesaid metal or a plastic film on which the aforesaid metal has been deposited. Particularly preferred is an aluminum plate because of its dimentional stability and low cost. Also preferred are composite sheets composed of a polyethylene sheet on which an aluminum film is bonded such as those disclosed in J.P. KOKOKU No. 48-18327.

(Primer Layer)

A primer layer for dry PS plates as used herein must fulfill the following requirements. The primer layer must sufficiently adhere the light-sensitive layer to the substrate, it must be stable over a long period of time and it must have good resistance to solvent used in the developer.

Moreover, the primer layer of image areas is exposed after development and stained during or after the development so that plate inspection can easily be made. Thus, the primer layer must easily be stained.

Examples of such primer layer include gelatin film which is set with an appropriate film hardening agent. Besides, it can be used epoxy resins and polyurethane resins which are heated to harden in the presence of a hardening agent. Particularly preferred is gelatin hardened with a film hardening agent.

Gelatin used as a material for primer layer of the invention may be so-called gelatin for photographs prepared by treating bones or skins of cattle with an acid or an alkali. In addition, any gelatins which are natural polymeric compounds composed of a variety of amino acids condensed with one another represented by the following general formula:

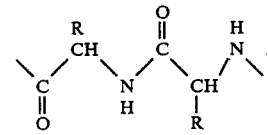

wherein R represents hydrogen, alkyl (e.g. methyl, isopropyl, 2-methylpropyl and isobutyl), carboxyalkyl (e.g. carboxymethyl and carboxyethyl), hydroxyalkyl (e.g. hydroxymethyl, 1-hydroxyethyl) or mercaptoalkyl (e.g. mercaptomethyl).

The gelatin comprises various kinds of amino acids and its composition varies depending on the purification conditions and its source.

Examples of the agents for hardening or cross-linking the gelatin are as follows:

(A) Inorganic Hardening Agents: chromium alum and aluminum alum;

(B) Organic Hardening Agents:

(B-1) Aldehyde type hardening agents such as formaldehyde, glyoxal, succinaldehyde, and glutaraldehyde;

(B-2) N-Methylol or acetal type hardening agents such as

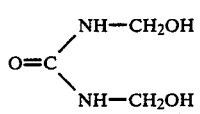

(B-3) Epoxy type hardening agents such as

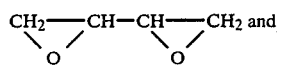

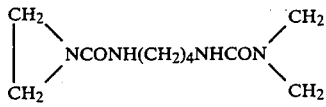

(B-4) Aziridine type hardening agents such as

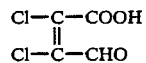

(B-5) Mucohalogeno acid type hardening agents such as

(B-6) Active halogen type hardening agents such as $$ClCH_2\overset{O}{\underset{\|}{C}}-NH(CH_2)_4NH-\overset{O}{\underset{\|}{C}}-CH_2Cl;$$

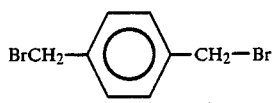

and

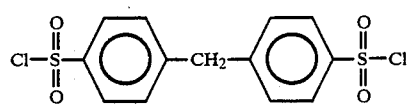

(D-7) Dichloro-s-triazine type hardening agents such as

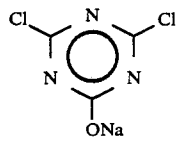

(B-8) Active olefin type hardening agents such as

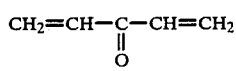

(B-9) Carbodiimide type hardening agents such as

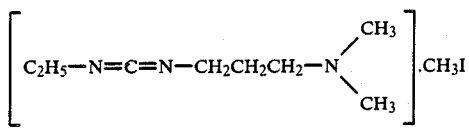

(B-10) Isoxazolium salt type hardening agents such as

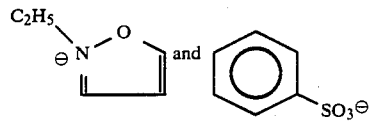

(B-11) Methanesulfonate type hardening agents such as

(B-12) Active ester type hardening agents such as

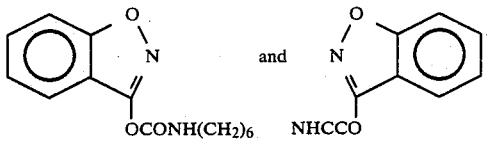

The kind of amino acid in the gelatin which undergoes the hardening reaction with the hardening agent varies depending on the kinds of the hardening agent used. The amino acid composition also varies depending on the kind of the gelatin employed.

For this reason, the optimum amount of the hardening agent used is determined depending on the kinds of the gelatin and the hardening agent used, but in general ranges from 1 to 200 mmole, preferably 5 to 100 mmol per 100 g of gelatin.

If the amount of the hardening agent is too small, the degree of swelling becomes extremely high and even if it is once dyed, it likely causes partial color fading when it is subsequently washed with water or the like.

The molar number of amino acids which are included in a constant amount of gelatin and which undergo film hardening reaction is fixed. Therefore, the use of the hardening agent in an amount greater than a desired amount would be meaningless and thus there is an upper limit with respect to the amount of the hardening agent.

The coated amount of gelatin primer is preferably in the range of 0.1 to 50 micron, more preferably 0.5 to 10 micron. In this respect, the term "coated amount" herein means the thickness of the gelatin primer layer measured after applying and drying. The hardening of the gelatin layer is preferably performed by an ordinary method which comprises heating after applying gelatin and the hardening agent to the surface of a substrate.

The primer layer may further comprise fillers such as titanium oxide, halation inhibiting agents, dyes for imparting print-out properties thereto, and/or acid-generating agents according to need.

(Light-sensitive Layer)

The photopolymerizable light-sensitive layer of the dry PS plates processed with the developer of the invention may have the following compositions:

(i) Monomers which have at least one photopolymerizable ethylenically unsaturated double bond and a boiling point of not less than 100° C. and which are nonvolatile at room temperature or oligomers thereof
-----1.0 to 99.9 parts by weight;
(ii) Photopolymerization initiator
-----0.1 to 20.0 parts by weight;
(iii) Optional heat polymerization inhibitor
-----0.01 to 1.0 parts by weight;
(iv) Optional polymers or inorganic powder as a filler for imparting form retention property to the photopolymerizable adhesive layer
-----0.01 to 95.0 parts by weight.
Each component will be detailed below.

(i) Photopolymerizable monomers or oligomers

Typical examples thereof are (meth)acrylates or (meth)acrylamides having a boiling point of not less than 100° C., derived from primary alcohols or primary amines having not more than 30 carbon atoms; or (meth)acrylates or (meth)acrylamides having a boiling point of not less than 100° C., derived from polyfunctional alcohols or polyfunctional amines having not more than 80 carbon atoms.

Typical monomers useful in the present invention will be listed below. Some of them may be used as a starting material for oligomers useful in the invention.

(i-i) (Meth)acrylates of the following alcohols:
methanol, ethanol, propanol, pentanol, cyclohexanol, octanol, undecanol, bornyl alcohol, polymethylene glycol, ethylene glycol, polyethylene glycol, propylene glycol, polypropylene glycol, glycerol, trimethylol methane, pentaerythrytol;

(i-ii) Adducts of (meth)acrylic acid glycidyl ester with, for instance, a hydrogen halide, an amine or a carboxylic acid; and ring opening polymers of glycidyl group such as:

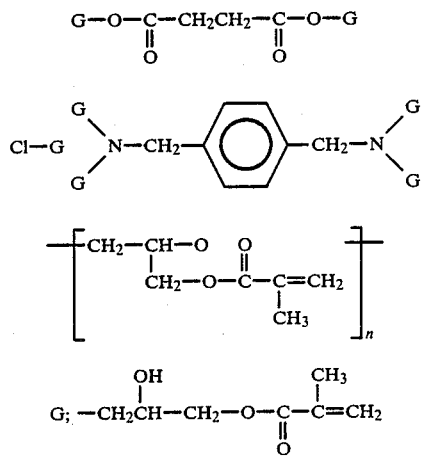

(i-iii) (Meth)acrylamide derivatives such as (meth)acrylamide, N-methylol (meth)acrylamide, N-methoxymethyl (meth)acrylamide, methylene-bis(meth)acrylamide, hexamethylenebis(meth)acrylamide, diacetone acrylamide and hydroxymethyl diacetone acrylamide.

Examples of the most useful monomers used in the photopolymerizable light-sensitive layer which can be processed with the developer of this invention include ethylene glycol di(meth)acrylate, polyethylene glycol di(meth)acrylate, trimethylol ethane tri(meth)acrylate, trimethylol propane tri(meth)acrylate, pentaerythritol tetra(meth)acrylate, pentaerythritol tri(meth)acrylate, dipentaerythritol penta(meth)acrylate and dipentaerythritol hexa(meth)acrylate.

(ii) Photopolymerization Initiators

The following compounds can be listed as typical examples of the photopolymerization initiators used in the present invention.

(ii-1) Benzophenone derivatives such as benzophenone, Michler's ketone, xanthone, anthrone;

(ii-2) Benzoin derivatives such as benzoin, benzoin ethyl ether, benzoin methyl ether;

(ii-3) Quinones such as p-benzoquinone, beta-naphthoquinone and beta-methylanthraquinone;

(ii-4) Sulfur-containing compounds such as dibenzyl disulfide and di-n-butyl disulfide;

(ii-5) Azo or diazo compounds such as 2-azobisisobutylonitrile, 1-azo-bis-1-cyclohexanecarbonitrile, p-diazobenzyl ethylaniline and Congo Red;

(ii-6) Halides such as carbon tetrabromide, silver bromide, alpha-chloromethylnaphthalene and trihalomethyl-s-triazine type compounds;

(ii-7) Peroxides such as benzoyl peroxide;

(ii-8) Uranyl compounds such as uranyl nitrate.

(iii) Heat Polymerization Inhibitors

As the heat polymerization inhibitors, there may be used hydroquinone derivatives, phenol derivatives, nitro-substituted benzenes, tertiary amines and phenothiazine derivatives.

(iv) Other Additives

Examples of fillers or additives include fine powder of inorganic substances such as colloidal silica, calcium carbonate and magnesium carbonate; polyvinyl acetate, poly(meth)acrylates, polyethylene having a molecular weight of several thousands, polypropylene, vinyl polymers such as polyvinyl chloride and polyvinylidene chloride; and uncured resol-phenol type, urea type, melamine type, epoxy type or unsaturated polyester type resins.

In addition to the foregoing components, the light-sensitive layer may contain dyes or pigments for dyeing the same. It is also possible to add pH indicators as agents or compositions for obtaining a visible image immediately after imagewise exposure or the like.

(Preferred Photopolymerizable Light-sensitive Layer)

More preferred photopolymerizable light-sensitive layer of the dry PS plate processed by the invention comprises the following water-soluble light-sensitive composition which is composed of:

(a) a polymer which is water-soluble or water-swellable at ordinary temperature and whose copolymerization components are at least one monomer represented by the following general formula (I) and an ethylenically unsaturated monomer having hydrophilic groups:

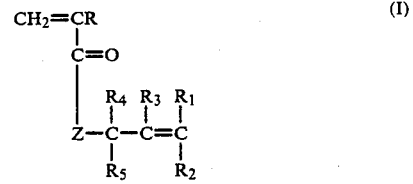

in the formula (I), R represents a hydrogen atom or a methyl group; $R_1$ to $R_5$ each represents a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group or an arylsulfonyl group; and Z represents an oxygen or sulfur atom or a group: —NH— or —NR'— (wherein R' represents an alkyl group) and an ethylenically unsaturated monomer having hydrophilic groups;

(b) a monomer or an oligomer having at least one photopolymerizable ethylenically unsaturated double bond; and (c) a photopolymerization initiator.

Each component of this composition will be detailed below.

(a) Copolymer

Examples of the monomers represented by the general formula (I) are allyl acrylate,

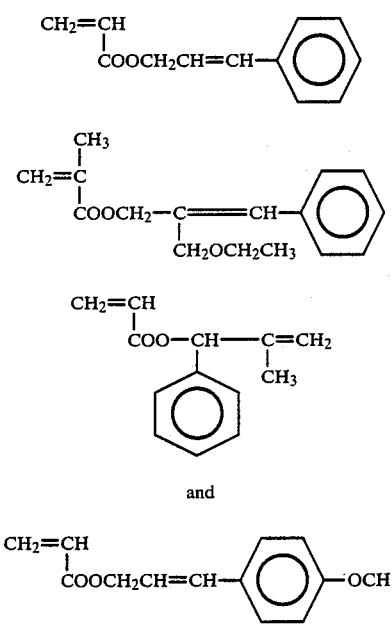

and

On the other hand, examples of the ethylenically unsaturated monomers having hydrophilic groups are ethylenically unsaturated monomer containing groups such as carboxyl groups, sulfonyl groups or phosphonyl groups in the form of alkali metal salts or ammonium salts, or ethylenically unsaturated monomers such as acrylamide, vinylpyrrolidone and vinyl alcohol.

Examples of the copolymers are those having, on the side chains, unsaturated double bonds and carboxyl groups which have been neutralized with an alkali metal hydroxide or an organic amine, as disclosed in J.P. KOKAI No. 59-46643. Among these, most preferred are those of allyl methacrylate and methacrylic acid which have been neutralized with an alkali. The acid value of these copolymers prior to the neutralization with an alkali is preferably not less than 20 to make the copolymer water-soluble.

These copolymers may be neutralized with an alkali metal hydroxide or an organic amine and specific preferred examples of such alkali include sodium hydroxide, potassium hydroxide, lithium hydroxide, monoethanolamine, diethanolamine and triethanolamine.

Preferred copolymers used in the light-sensitive layer of the PS plates processed in the invention can be prepared by copolymerizing at least one monomer having unsaturated groups and represented by the formula (I) and an ethylenically unsaturated monomer having hydrophilic groups, but they may further comprise, as the third component, another monomer such as alkyl (meth)acrylates, benzyl (meth)acrylate, 2-hydroxyethyl (meth)acrylate or acrylonitrile.

In these copolymers, the amount of the repeating units derived from the monomer represented by the formula (I) and that derived from the ethylenically unsaturated monomer having hydrophilic groups in general range from 10 to 90 mole % and 5 to 60 mole %, preferably 40 to 85 mole % and 10 to 30 mole % respectively. The molecular weight of the copolymer desirably ranges from 10,000 to 500,000, more desirably 20,000 to 200,000.

(b) Photopolymerizable Monomers or Oligomers

The aforesaid substances may be used as a monomer or oligomer having at least one photopolymerizable ethylenically unsaturated double bond which can be incorporated into the light-sensitive layer of the PS plates processed with the developer of the invention.

The ratio of these monomers or oligomers to the water-soluble copolymer preferably ranges from 0:10 to 7:3, more preferably 1.0:9.0 to 5:5.

(c) Photopolymerization Initiator

The aforementioned photopolymerization initiators may be used as a photopolymerization initiator to be incorporated into the water-soluble light-sensitive composition used in the invention, but particularly useful are water-soluble photopolymerization initiators listed below. Specific examples of such water-soluble photopolymerization initiators are 1-(4'-dodecylphenyl)-2-hydroxy-2-methylpropane and compounds represented by the following formulas:

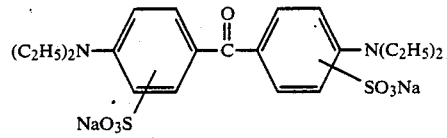

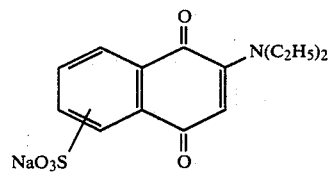

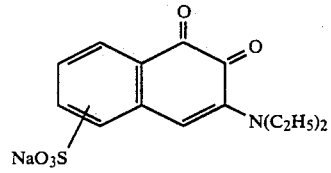

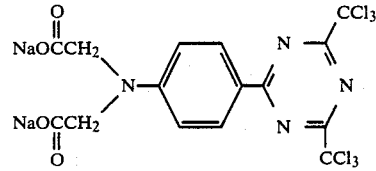

-continued

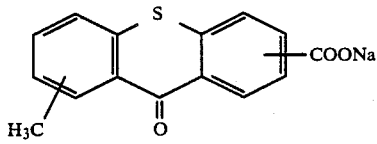

The amount of these photopolymerization initiators to be incorporated ranges from 0.1 to 20% by weight and preferably 1 to 10% by weight on the basis of the total weight of the composition.

The light-sensitive composition preferably contains a heat polymerization inhibitor. Examples of the useful such inhibitors are hydroquinone, p-methoxyphenol, di-t-butyl-pcresol, pyrogallol, t-butylcatechol, benzoquinone, 4,4'-thiobis(3-methyl-6-t-butylphenol), 2,2'-methylenebis(4-methyl6-t-butylphenol) and 2-mercaptobenzimidazole. Moreover, it may further comprise dyes or pigments for dyeing the light-sensitive layer or a pH indicator as an agent or composition for obtaining a visible image immediately after imagewise exposure. Further, it may optionally contain other water-soluble polymers such as polyvinyl alcohol, polyvinyl pyrrolidone, polyethylene glycol, polyvinyl alcohol partially modified with acetal, water-soluble nylon, water-soluble urethane, gum arabic, water-soluble cellulose derivatives and gelatin.

The thickness of the light-sensitive layer explained above is not critical, but it is preferably as thin as possible to obtain concave portions serving as image areas after removing the silicone rubber layer and the light-sensitive layer in non-exposed areas. It is generally desirable to limit the thickness to not more than 10 microns, in particular to 0.1 to 5 microns.

(Silicone Rubber Layer)

The silicone rubber layer of the PS plates processed by the invention mainly comprises linear organic polysiloxanes which have the following repeating units and a molecular weight ranging from several thousands to several hundreds of thousands:

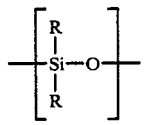

wherein R represents an alkyl group having 1 to 10 carbon atoms or a phenyl group and preferably not less than 60% of R is methyl group. Such a linear organic polysiloxane in general contains a reactive cross-linking agent and thus converted to cross-linked silicone rubber. The examples of cross-linking agents incorporated into a so-called room-temperature (or low-temperature) setting silicone rubber include silanes with or without monovalent organic groups bonded to the silicon atom, such as acetoxysilane, ketoximesilane, aminoxysilane, amidosilane, alkoxysilane and hydroxysilane; siloxanes which are condensates thereof having a low degree of polymerization and organo-hydrogen polysiloxane. The silicone rubber composition may optionally contain, for instance, reactive silane compounds having allyl isocyanurate groups or reactive silane compounds having aminoalkyl groups to enhance the adhesion between the light-sensitive layer and the silicone rubber layer and to prevent the lowering of the adhesion therebetween even after a long term storage.

The amount of the foregoing reactive cross-linking agents and/or the reactive silane compounds to be incorporated into the silicone rubber layer preferably ranges from 0.05 to 10%, more preferably 0.1 to 5%. Alternatively, these adhesive components may be used in combination.

The silicone rubber layer in general contains a small amount of organotin compound or the like as a catalyst.

From the viewpoint of tone reproduction, the thickness of the silicone rubber layer is desirably as thin as possible. On the contrary, the silicone rubber layer should be relatively thick from the viewpoint of printing durability and background contamination. Therefore, it is preferably in the range of 0.5 to 10 microns and more preferably 1.0 to 3.0 microns.

(Protective Layer)

The dry PS plates processed with the developer of the present invention may optionally be provided with a protective layer such as a plastic film on the silicone rubber layer. Examples thereof are polyethylene, polypropylene, polyvinyl chloride, polyvinylidene chloride, polyvinyl alcohol, polyethylene terephthalate and cellophane films.

(Developer)

The developer of this invention has the following composition:

(i) an organic solvent which can dissolve or swell non-exposed portions of the photopolymerizable light-sensitive layer and whose solubility in water at ordinary temperature is not more than 20% by weight;

(ii) a surfactant; and (iii) water.

Each component of the developer will be detailed below.

(i) Organic Solvents

Examples of the organic solvents (i) which can dissolve or swell non-exposed portions of the photopolymerizable light-sensitive layer and whose solubility in water at ordinary temperature is not more than 20% by weight include dibutyl ketone, acetophenone, isophorone, diethyl succinate, methyl benzoate, diethyl oxalate, dimethyl phthalate, isobutyl acetate, benzyl benzoate, ethylene glycol monophenyl ether, ethylene glycol dibutyl ether, ethylene glycol benzyl ether, diethylene glycol di-n-butyl ether, ethylene glycol diacetate, n-amyl alcohol and benzyl alcohol.

However, the invention is not restricted to these specific examples. Among these, particularly preferred are diethyl succinate, dimethyl phthalate, benzyl benzoate, ethylene glycol monophenyl ether, diethylene glycol di-n-butyl ether, ethylene glycol diacetate and benzyl alcohol.

The amount of these organic solvents in the developing composition ranges from 1 to 30% by weight and preferably 2 to 20% by weight of the composition.

(ii) Surfactants

In the developer of the invention, the surfactant component may be any one such as anionic, nonionic, cationic or amphoteric surfactants, but particularly useful are anionic and nonionic ones. Examples of the anionic surfactants are fatty acid salts, abietic acid salts, hydroxyalkane sulfonic acid salts, alkane sulfonic acid salts, dialkyl sulfosuccinic acid salts, linear alkylbenzene sulfonic acid salts, branched alkylbenzene sulfonic acid salts, alkylnaphthalene sulfonic acid salts, alkyl diphenyl ether sulfonic acid salts, alkylphenoxy polyoxyethylenepropyl sulfonic acid salts, polyoxyethylene alkylsulfophenyl ether salts, sodium N-methyl-N-oleyl taurine, disodium N-alkylsulfosuccinic acid monoamide, petroleum sulfonic acid salts, sulfated castor oil, sulfated tallow, sulfate salts of fatty acid alkyl esters, alkyl sulfate salts, polyoxyethylene alkyl ether sulfate salts, fatty acid monoglyceride sulfate salts, polyoxyethylene alkylphenyl ether suluric acid ester salts, polyoxyethylene styrylphenyl ether sulfate salts, alkylphosphate salts, polyoxyethylene alkyl ether phosphate salts, polyoxyethylene alkylphenyl ether phosphate salts, partially saponified products of styrene/maleic acid copolymer, partially saponified products of olefin/maleic anhydride copolymer and condensates of naphthalenesulfonate salt-formalin.

Among these, particularly preferred are alkylnaphthalene sulfonate salts, alkyl diphenyl ether sulfonate salts, linear alkylbenzenesulfonate salts and polyoxyethylene alkylphenyl ether sulfate salts.

Examples of the nonionic surfactants are poolyoxyethylene alkyl ethers, polyoxyethylene alkylphenyl ethers, polyoxyethylene polystyrylphenyl ethers, polyoxyethylene polyoxypropylene alkyl ethers, partially esterified glycerin fatty acids, partially esterified sorbitan fatty acids, partially esterified pentaerythritol fatty acids, propylene glycol monofatty acid esters, partially esterified sucrose fatty acids, partially esterified polyoxyethylene sorbitan fatty acids, partially esterified polyoxyethylene sorbitol fatty acids, polyethylene glycol fatty acid esters, partially esterified polyglycerin fatty acids, polyoxyethylene modified castor oils, partially esterified polyoxyethylene glycerin fatty acids, fatty acid diethanolamides, N,N-bis-2-hydroxyalkylamines, polyoxyethylene alkylamines, triethanolamine fatty acid esters and trialkylamine oxides. Among these, preferred are polyoxyethylene alkylphenyl ethers, and polyoxyethylene-polyoxypropylene block copolymers.

Examples of the cationic surfactants are alkylamine salts, quaternary ammonium salts, polyoxyethylene alkylamine salts and polyethylene polyamine derivatives.

These surfactants are used in an amount ranging from 0.01 to 30% by weight, preferably 0.1 to 20% by weight on the basis of the total amount of the composition.

The developer of the present invention does not require the use of any organic solvent capable of swelling the silicone rubber layer. Therefore, such an organic solvent is used only in a small amount. For this reason, the developer is very safe from the viewpoint of preventing firing and health of operators.

The elimination of the use of the organic solvent capable of swelling the silicone rubber layer makes it possible to disuse a surfactant for solubilizing such a solvent in water. Thus, regarding the organic materials, the developer of this invention simply comprises an organic solvent for dissolving or swelling non-exposed areas of the photopolymerizable light-sensitive layer and a surfactant for stably dispersing the organic solvent in water.

In addition to the aforesaid compounds, the developer may contain dyes such as Crystal Violet and Astrazone Red to simultaneously develop the PS plates and dye image areas.

(Method for Making Plates)

The development can be performed by any known methods which comprises, for instance, rubbing the PS plates with a developing pad containing a developer; or rubbing the surface of the plate with a developing brush after pouring a developer thereon. Thus the silicone rubber layer and the light-sensitive layer in non-exposed areas (image areas) are removed and the surface of the primer layer is exposed, the exposed portions serving as ink-receiving portions. Alternatively, it is also possible to simultaneously develop the plate and dye the image areas by previously adding dyes such as Crystal Violet or Astrazone Red to the developer. The dyeing of the image portions may also be carried out by dyeing them with a dyeing solution containing dyes such as Crystal Violet or Astrazone Red.

As the light sources for imagewise exposing the PS plate, there may be used ultrahigh pressure mercury lamp, carbon arc lamp, metal halide lamps, xenon lamp, chemical lamp, fluorescent lamp or solar rays.

The developer of the present invention is free from organic solvents for swelling the silicone rubber layer and, therefore, it is very safe in view of preventing firing and health of operators. This further makes the design of an automatic developing machine simpler since it does not need a means therefor and it becomes less expensive.

In addition, the silicone rubber layer in non-image areas of the PS plate never causes scratches during development since the developer of this invention is free from organic solvents capable of swelling the silicone rubber layer.

The developer of this invention has a low content of organic substances and mainly comprises water. Therefore, the production cost thereof is very low.

Moreover, the light-sensitive layer to be processed with the developer of the invention is a photopolymerizable light-sensitive composition and comprises monomers or oligomers. As a result, the light-sensitive layer in non-exposed areas can rapidly be dissolved in or get swollen with the developer and, therefore, the PS plate is excellent in developing properties and dot reproduction.

The present invention will hereunder be described in more detail with reference to the following non-limitative working Examples and the effects practically attained by the present invention will also be discussed in comparison with Comparative Examples.

EXAMPLE 1

The following composition for primer layer was applied to the surface of a smooth aluminum plate, which had been degreased by an ordinary method, in an amount of 1.0 g/m² (weighed after drying) and was heated at 100° C. for two minutes to dry and harden the resulting film.

| (Composition for Primer Layer) | |
|---|---|
| Component | Amount (parts by weight) |
| Gelatin for photograph 680 (available from NITTA GELATIN CO., LTD.) | 100 |
|  | 11.3 |
| N-beta-(aminoethyl)-gamma-aminopropyl-trimethoxysilane | 7 |
| Pure Water | 4000 |

The following photopolymerizable light-sensitive composition was applied to the surface of the aluminum plate to which the primer layer had been applied, in an amount of 1.0 g/m² (weighed after drying) and then was dried.

(Photopolymerizable Light-sensitive Composition)

| Component | Amount (parts by weight) |
|---|---|
| Copolymer of allyl methacrylate and beta-hydroxyethyl methacrylate (molar ratio = 9:1; molecular weight = about 40,000) | 80 |
| Dipentaerythritol hexaacrylate | 20 |
| 2-(4-Styrylphenyl)-4,6-bis-trichloromethyl-s-triazine | 6 |
| Propylene glycol monomethyl ether acetate | 1100 |
| Methyl ethyl ketone | 1100 |

Then the following silicone rubber composition was applied onto the foregoing light-sensitive layer in an amount of 1.3 g/m² (weighed after drying) and was dried to obtain hardened silicone rubber layer.

(Silicone Rubber Composition)

| Component | Amount (parts by weight) |
|---|---|
| Dimethyl polysiloxane having hydroxyl group on both terminus thereof (molecular weight = about 100,000) | 100 |
| Methyl hydrogen polysiloxane having trimethylsilyl groups on both terminus thereof (molecular weight = about 2,500) | 3.5 |
| 1-Trimethoxysilylpropyl-3,5-diallyl-isocyanurate | 6 |
| Dibutyltin dioctanoate | 3.3 |
| Isopar G (available from ESSO CHEMICAL CO., LTD.) | 1800 |

A polypropylene film of 12 microns thick whose one side had been matted was laminated with the silicone rubber layer thus obtained to complete a dry PS plate.

The PS plate was exposed to light for 30 counts through a positive transparency which had been superposed thereon and brought into contact therewith in vacuo utilizing ET 26V UDNS ULTRAPLUS FLIP-TOP PLATE MAKER (available from Nu Arc Co., Ltd.), then the laminate film was removed and the plate surface was lightly rubbed with a developing pad for one minutes after pouring the following developer thereon to remove the light-sensitive layer and the silicone rubber layer in the non-exposed areas. Thus, a dry lithographic printing plate which faithfully reproduced the image of the positive transparency in the whole surface thereof was obtained.

(Developer)

| Component | Amount (parts by weight) |
|---|---|
| Benzyl alcohol (solubility in water at 20° C. = 3.8% by weight) | 80 |
| Pelex NBL (38% aqueous solution of anionic surfactant; available from Kao Atlas Co. Ltd.) | 75 |
| Water | 845 |

The resultant lithographic printing plate was installed on a press machine LISLON 26 (available from KOMORI PRESS MACHINE CO., LTD.) from which a device for supplying dampening water had been dismantled and printing operation was performed using TOYO KING ULTRA TKU Aqualess G Sumi ink (available from Toyo Ink Manufacturing Co., Ltd.). Thus 10,000 sheets of printed matters free of background contamination were obtained and their fine dots reproduction was also good.

EXAMPLES 2 TO 4 AND COMPARATIVE EXAMPLE 1 TO 2

Dry PS plates were prepared by applying the same primer layer, light-sensitive layer and silicone rubber layer as in Example 1 on the same substrate as in Example 1 and then laminating it with the same polypropylene film as in Example 1.

The PS plates thus prepared were imagewise exposed to light and the laminate film was removed, as in Example 1. The imagewise exposed plates were developed in the manner similar to that in Example 1 using developers listed in Table I.

As seen from Table I, the developing properties of these plates varied depending on the solubility of the organic solvent used in the developer.

TABLE I

| | Composition of Developer | | | | | |
|---|---|---|---|---|---|---|
| | Solubility of organic solvent at | Amount of the Component (% by weight) | | | | |
| Component | 20° C. (%) | Ex. 2 | Ex. 3 | Ex. 4 | C.E. 1 | C.E. 2 |
| (i) organic solvent | | | | | | |
| Diethylene glycol di-n-butyl ether | 0.3 | 10.0 | — | — | — | — |
| Dimethyl phthalate | 0.4 | — | 5.0 | — | — | — |
| Ethylene glycol diacetate | 16.4 | — | — | 20.0 | — | — |
| Diethylene glycol monomethyl ether | free mixing | — | — | — | 10.0 | — |
| Diethylene glycol mono-n-butyl ether | free mixing | — | — | — | — | 25.0 |
| (ii) Pelex NBL (38% aqueous solution of anionic surfactant; available from Kao Atlas Co., Ltd.) | | 16.2 | 10.0 | 7.2 | 10.0 | 10.0 |
| (iii) Water | | 73.8 | 85.0 | 72.8 | 80.0 | 65 |
| Developing Properties | | good | good | good | bad | bad |

C.E.: Comparative Example.

As seen from the results summarized in Table I, good developing properties are observed in Examples 2 to 4 in which the solubility of the organic solvent in water was not more than 20% by weight. On the other hand, if a developer containing an organic solvent having high solubility in water is used as in Comparative Examples 1 and 2, the development is insufficient.

EXAMPLE 5

An original plate was prepared by producing a PS plate in the same manner as in Example 1, imagewise exposed to light and removing a laminate film. The original plate was rubbed with a developing pad containing the following developing composition and thus the light-sensitive layer and the silicone rubber layer in non-exposed areas were rapidly removed.

| (Developing Composition) | |
|---|---|
| Component | Amount (parts by weight) |
| Benzyl alcohol | 60 |
| Nonipol 300 (nonionic surfactant available from SANYO CHEMICAL INDUSTRIES, LTD.) | 60 |
| Water | 880 |

As in Example 1, the printing operation was carried out utilizing the resultant dry lithographic printing plate. As a result, clear printed matters having no background contamination were obtained. The reproduction of fine dots was also good.

EXAMPLE 6

The following photopolymerizable light-sensitive composition was applied onto the same primer layer formed on a substrate as in Example 1 in an amount of 1.0 g/m² (weighed after drying) and then dried.

| (Light-sensitive Composition) | |
|---|---|
| Component | Amount (g) |
| Pentaerythritol triacrylate | 0.7 |
| Poly(allyl methacrylate/sodium methacrylate) (copolymerization molar ratio = 80/20) | 2.0 |
| 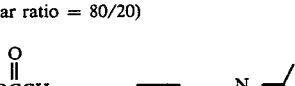 | 0.1 |
| Methanol | 15 |
| Water | 25 |

Then the same silicone rubber composition as in Example 1 was applied to the light-sensitive layer in an amount of 1.5 g/m² and was dried to form hardened silicone rubber layer. Thereafter, the resultant plate was laminated with the same polypropylene film as in Example 1 to obtain a dry PS plate. As in Example 1, the original plate thus prepared was imagewise exposed to light, the laminated film was removed and the plate surface was rubbed with a developing pad using the following developer for 30 seconds. The light-sensitive layer and the silicone rubber layer in non-exposed areas were rapidly removed.

| (Developer) | |
|---|---|
| Component | Amount (parts by weight) |
| Ethylene glycol monophenyl ether (solubility in water at 20° C. = 2.7% by weight) | 80 |
| Pelex NBL | 70 |
| Water | 850 |

Moreover, the original plate for printing was treated with an aqueous solution containing 0.5% by weight of Crystal Violet to dye the portions from which the light-sensitive layer and the silicone rubber layer had been removed (non-exposed areas) and thus a dry lithographic printing plate on which the images carried by the positive film were faithfully reproduced was obtained.

What is claimed is:

1. A process for the development of an exposed dry PS plate comprising a substrate provided thereon with (1) a primer layer, (2) a photopolymerizable light-sensitive layer comprising (a) a water-soluble or water-swellable copolymer comprising, as copolymerizable components, at least one monomer represented by the following general formula (I):

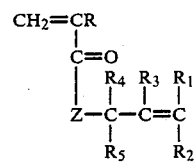

wherein R represents a hydrogen atom or a methyl group; $R_1$ to $R_5$ each represents a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group or an arylsulfonyl group; and Z represents an oxygen or sulfur atom or a group: —NH— or —NR'— (wherein R' represents an alkyl group) and an ethylenically unsaturated monomer having hydrophilic groups; (b) a monomer or an oligomer having at least one photopolymerizable ethylenically unsaturated double bond; and (c) a photopolymerization initiator and (3) a silicone rubber layer in this order, said process comprising, after image-wise exposure, contacting said plate with a developer to remove said photopolymerizable light-sensitive layer and corresponding areas of said silicone rubber layer in non-exposed areas to give a dry lithographic printing plate, and wherein a developer comprises:
   (i) an organic solvent which can dissolve or swell the non-exposed areas of the photopolymerizable light-sensitive layer and whose solubility in water at ordinary temperature is not more than 20% by weight;
   (ii) a surfactant; and
   (iii) water, the developer being substantially free from any organic solvent capable of swelling the silicone rubber layer.

2. A process of claim 1 wherein the photopolymerizable light-sensitive layer comprises a water-soluble light-sensitive composition.

3. A process of claim 1 wherein the organic solvent is at least one member selected from the group consisting of dibutyl ketone, acetophenone, isophorone, diethyl succinate, methyl benzoate, diethyl oxalate, dimethyl phthalate, benzyl benzoate, ethylene glycol monophenyl ether, ethylene glycol benzyl ether, ethylene glycol diacetate, and benzyl alcohol.

4. A process of claim 3 wherein the organic solvent is at least one member selected from the group consisting of diethyl succinate, dimethyl phthalate, benzyl benzoate, ethylene glycol monophenyl ether, ethylene glycol diacetate and benzyl alcohol.

5. A process of claim 1 wherein the amount of the organic solvent in the developer ranges from 1 to 30% by weight based on the total weight of the developer.

6. A process of claim 5 wherein the amount of the organic solvent in the developer ranges from 2 to 20% by weight based on the total weight of the developer.

7. A process of claim 1 wherein the surfactant is anionic, nonionic, cationic and/or amphoteric surfactants.

8. A process of claim 7 wherein the surfactant is anionic and/or nonionic ones.

9. A process of claim 7 wherein the anionic surfactant is at least one member selected from the group consisting of fatty acid salts, abietic acid salts, hydroxyalkane sulfonic acid salts, alkane sulfonic acid salts, dialkyl sulfosuccinic acid salts, linear alkylbenzene sulfonic acid salts, branched alkylbenzene sulfonic acid salts, alkylnaphthalene sulfonic acid salts, alkyl diphenyl ether sulfonic acid salts, alkylphenoxy polyoxyethylenepropyl sulfonic acid salts, polyoxyethylene alkylsulfophenyl ether salts, sodium N-methyl-N-oleyl taurine, disodium N-alkylsulfosuccinic acid monoamide, petroleum sulfonic acid salts, sulfated castor oil, sulfated tallow, sulfate salts of fatty acid alkyl esters, alkyl sulfate salts, polyoxyethylene alkyl ether sulfate salts, fatty acid monoglyceride sulfate salts, polyoxyethylene alkylphenyl ether sulfuric acid ester salts, polyoxyethylene styrylphenyl ether sulfate salts, alkylphosphate salts, polyoxyethylene alkyl ether phosphate salts, polyoxyethylene alkylphenyl ether phosphate salts, partially saponified products of styrene/maleic acid copolymer, partially saponified products of olefin/maleic anhydride copolymer and condensates of naphthalenesulfonate salt-formalin.

10. A process of claim 9 wherein the anionic surfactant is selected from alkylnaphthalene sulfonate salts, alkyl diphenyl ether sulfonate salts, linear alkylbenzenesulfonate salts and polyoxyethylene alkylphenyl ether sulfate salts.

11. A process of claim 7 wherein the nonionic surfactant is at least one member selected from the group consisting of polyoxyethylene alkyl ethers, polyoxyethylene alkylphenyl ethers, polyoxyethylene polystyrylphenyl ethers, polyoxyethylene polyoxypropylene alkyl ethers, partially esterified glycerin fatty acids, partially esterified sorbitan fatty acids, partially esterified pentaerythritol fatty acids, propylene glycol monofatty acid esters, partially esterified sucrose fatty acids, partially esterified polyoxyethylene sorbitan fatty acids, partially esterified polyoxyethylene sorbitol fatty acids, polyethylene glycol fatty acid esters, partially esterified polyglycerin fatty acids, polyoxyethylene modified castor oils, partially esterified polyoxyethylene glycerin fatty acids, fatty acids diethanolamides, N,N-bis-2-hydroxyalkylamines, polyoxyethylene alkylamines, triethanolamine fatty acid esters and trialkylamine oxides.

12. A process of claim 11 wherein the nonionic surfactant is selected from polyoxyethylene alkylphenyl ethers, and polyoxyethylene-polyoxypropylene block copolymers.

13. A process of claim 7 wherein the cationic surfactant is at least one member selected from the group consisting of alkylamine salts, quaternary ammonium salts, polyoxyethylene alkylamine salts and polyethylene polyamine derivatives.

14. A process of claim 1 wherein the surfactant is used in an amount ranging from 0.01 to 30% by weight based on the total weight of the developer.

15. A process of claim 14 wherein the amount of the surfactant ranges from 0.1 to 20% by weight on the basis of the total weight of the developer.

16. a process of claim 1 wherein it further contains dyes.

17. A process of claim 16 wherein the dye is Crystal Violet or Astrazone Red.

18. A process of claim 1 wherein the acid value of the copolymer (a) prior to its neutralization is not less than 20.

19. A process of claim 1 wherein the ratio of the monomers or oligomers to the water-soluble copolymer ranges from 1.0:9.0 to 5:5.

* * * * *